United States Patent [19]

Purser

[11] Patent Number: 4,553,069

[45] Date of Patent: Nov. 12, 1985

[54] WAFER HOLDING APPARATUS FOR ION IMPLANTATION

[75] Inventor: Kenneth H. Purser, Manchester, Mass.

[73] Assignee: General Ionex Corporation, Newburyport, Mass.

[21] Appl. No.: 568,175

[22] Filed: Jan. 5, 1984

[51] Int. Cl.⁴ ............................................ A61K 27/02
[52] U.S. Cl. ............................ 315/111.81; 250/492.3; 414/222; 414/225
[58] Field of Search ................. 414/222, 225, 146; 250/492.2, 492.3, 442.1; 378/208; 315/111.8

[56] References Cited

U.S. PATENT DOCUMENTS

| | | | |
|---|---|---|---|
| 3,874,525 | 4/1975 | Hassan et al. | 414/225 |
| 3,921,788 | 11/1975 | Roberson et al. | 414/222 |
| 4,047,624 | 9/1977 | Dorenbos | 414/217 |
| 4,346,301 | 8/1982 | Robinson et al. | 250/492.2 |
| 4,398,079 | 8/1983 | Dard et al. | 250/492.2 |
| 4,498,833 | 2/1985 | Hertel | 414/222 |

*Primary Examiner*—Harold Dixon
*Attorney, Agent, or Firm*—Robert M. Asher

[57] ABSTRACT

An apparatus is disclosed for the implantation of ions into semiconductor wafers wherein a plurality of storage compartments are connected through valves to a vacuum chamber. A wafer handling device transfers wafers between the storage compartments and a wafer holding device. The wafer holding device positions the wafers in front of an ion beam source. The wafer holding device is a rotatable frustum having a rear end, front end and four trapezoidally shaped sides. Clamps are provided on each side for holding the wafer against the side.

23 Claims, 6 Drawing Figures

WAFER HOLDING APPARATUS FOR ION IMPLANTATION

BACKGROUND OF THE INVENTION

This invention relates to an apparatus for handling semiconductor wafers and positioning the wafers in front of an ion beam.

The onslaught of the computer age has brought an increasing need for semiconductor devices. Integrated circuits are made with semiconductors that have been doped with ions. To meet the increasing demand for doped semiconductors, the ion implantation of semiconductor wafers is performed by mass production. The semiconductor industry would benefit greatly by an increase in the thruput of wafers through an ion implantation process.

The doping of the wafers must take place within a vacuum. This presents one of the problems encountered in mass producing doped wafers. Time is often wasted by a depressurization step so that wafers can be passed from atomspheric pressure into a vacuum chamber. The repeated pumping down of the area surrounding a wafer before implantation slows the overall process.

One method known to the art for overcoming this difficulty is to have two locations where implantation takes place. A large and costly magnet system is used to switch the direction of the beam from one location to the other. In this approach while the beam is directed in one location the depressurization of the other location can take place. It would be desirable to eliminate the need for the large and costly magnet system.

Thruput can also be increased by increasing the intensity of the ion beam. This would reduce the amount of time necessary for the implantation step. However, the increase in power usage is inefficient and adds to the equipment cost. Also, the current expended during the time a wafer is being inserted into position for implantation is not put to a useful purpose. This current is wasted. It is the object of the present invention to reduce the amount of time required by the step of inserting a wafer into position for implantation, so that current is not wasted and thruput is increased.

SUMMARY OF THE INVENTION

This invention is directed to an apparatus for the implantation of ions into a semiconductor wafer. Two or more vacuum storage compartments are connected by valves to a vacuum chamber. One of the storage compartments is pumped down to a vacuum and the valve is opened between it and the vacuum chamber. Wafers stored in the compartment are transferred by a handling arm from the storage compartment to a wafer holding device. The holding device brings the wafers into position for implantation of ions by an ion beam directed into the vacuum chamber. After implantation, the handling arm removes the wafer from the holding device and returns it to the vacuumized storage compartment. While the wafers from the one storage compartment are being processed, the other storage compartment is filled with a new set of wafers and is pumped down to a vacuum. Then the valve between the vacuum chamber and this other compartment can be opened. The implantation process can be continued without interruption by alternating between compartments.

The wafer holding apparatus of this invention is a rotatable frustum having a front end, a rear end and four trapezoidally shaped sides. There are clamps on each side of the frustum for holding a wafer against the frustum. The frustum is supported by a shaft which is inclined relative to horizontal to support the frustum so that the top side is horizontal. A motor is connected to the shaft for rotating the shaft.

According to the present invention, continuous implantation of ions into the wafers can be achieved. The time for inserting a wafer into the ion beam is reduced to the time it takes for the frustum to rotate a partial revolution. The transfer of wafers by the handling device can be accomplished while another wafer is being subjected to the implantation process. Therefore, implantation time is not lost. Advantageously, the ion beam is directed in one location throughout the process and it need not be switched.

Other objects and advantages of the invention will become apparent during the following description of the presently preferred embodiment of the invention taken in conjunction with the drawings.

DETAILED DESCRIPTION OF THE PREFERRED EMBODIMENTS

Figure 1:
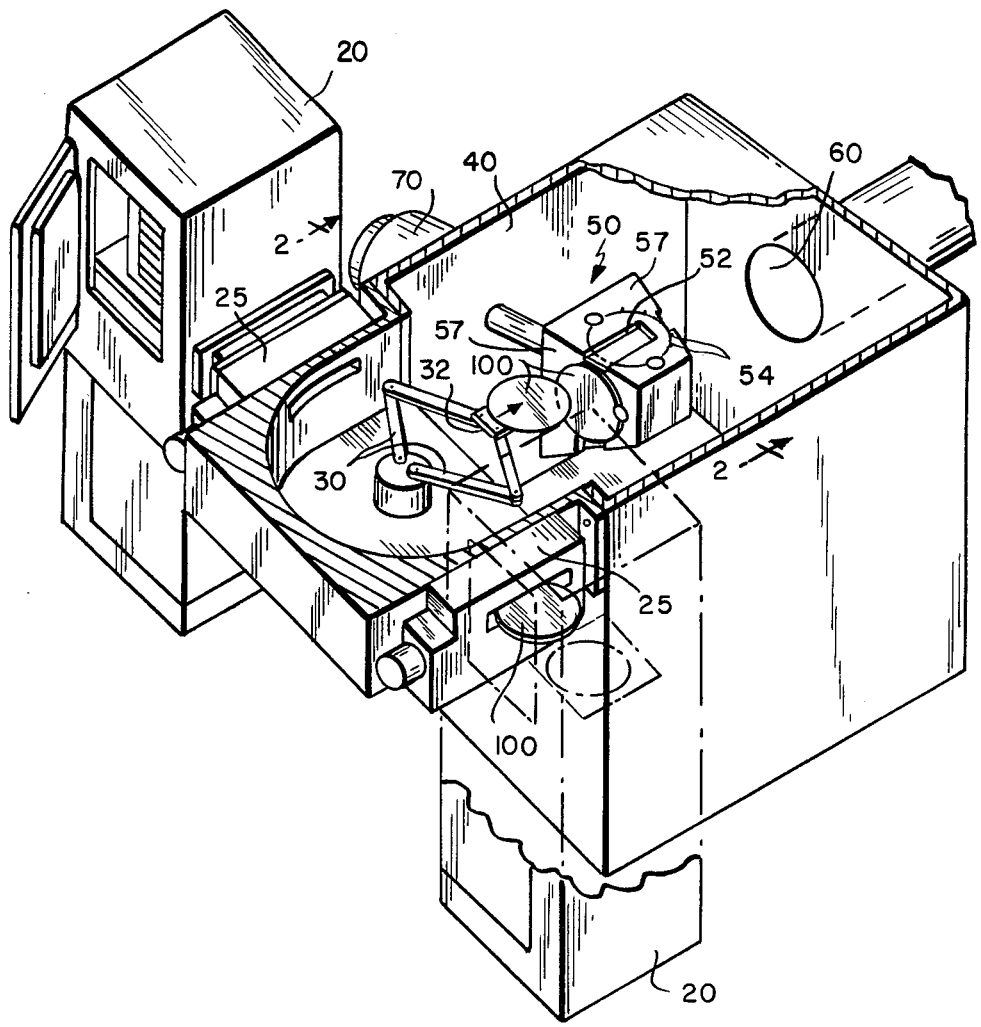
FIG. 1 is a perspective view with partial cross section of an ion implantation apparatus of the present invention.

The apparatus of the present invention includes a vacuum chamber 40 connected by valves 25 to a plurality of storage compartments 20. When a storage compartment 20 is at atmospheric pressure and its corresponding valve 25 is closed, wafers 100 are loaded into that storage compartment 20. Then the compartment is pumped down to a vacuum and its corresponding valve 25 is opened. Within the vacuum chamber 40, a robot arm 30 performs the task of handling the wafers 100, transferring them from the depressurized storage compartments to a wafer holding device. The holding device may be a multi-sided block. In the preferred embodiment, it is a four-sided frustum 50. The frustum 50 holds four wafers, one on each side and aligns one wafer in front of an ion beam 60 for implantation.

The presently preferred robot arm 30 for use as the wafer handling device is an ORBITRAN TM handler manufactured by Brooks Associates, Inc. This robot arm 30 has a platform 32 upon which the wafers are carried. The robot arm 30 removes wafers 100 that have undergone implantation from the top side of the frustum 50 and returns them to a storage compartment 20. The arm 30 then retrieves an unprocessed wafer 100 from the storage compartment 20 and places it on top of the frustum 50. This removal and replacement of a wafer 100 on top of the frustum takes about fifteen seconds to complete. While the transfer of wafers 100 is being performed, one wafer is being subjected to the ion beam 60 for the implantation process which takes approximately 30 seconds. Therefore, the transfer of the wafers does not affect the thruput of the ion implantation process. After one wafer has been implanted, the frustum 50 rotates a quarter revolution to align a new wafer 100 before the ion beam 60 for implantation. Thus, ion implantation is a continuous process according to the present invention. The only ion beam time which is lost is the small amount of time it takes the frustum to make its quarter revolution.

The handling of wafers is improved by providing elevators within the storage compartments 20 to raise or lower a stack of wafers to provide easy access to the robot arm 30. Significant time savings are also accomplished by providing at least two storage compartments 20 so that processing of wafers may alternate from a stack in one compartment to a stack in the other. In the presently preferred embodiment, the Vacuum Cassette Elevator identified as product number 3732 manufactured by Brooks Associates, Inc. of North Billerica, MA. is used as the storage compartment 20. The valve 25 used in conjunction with these vacuum cassette elevators 20 is the 6" Vacuum Isolation Valve which is production number 3003 of Brooks Associates, Inc. The vacuum cassette elevators include a vacuum pump (not shown) for pumping down the elevator to a pressure of $10_{-5}$ torr. or less. After the wafers 100 stacked within one vacuum cassette elevator 20 have all been processed in front of the ion beam 60, the valve 25 between that vacuum elevator 20 and the vacuum chamber 40 is closed. The vacuum elevator 20 is returned to atomspheric pressure and the processed stack of wafers 100 is removed. A new stack of unprocessed wafers 100 can be inserted into the vacuum elevator 20 and then the elevator can be depressurized back to a vacuum. Meanwhile, the ion implantation apparatus 10 has been performing the ion implantation process on the wafers of the other vacuum cassette elevator. Thus, the depressurization of the vacuum elevators does not contribute any delay to the continuous implantation of wafers.

Figure 2:
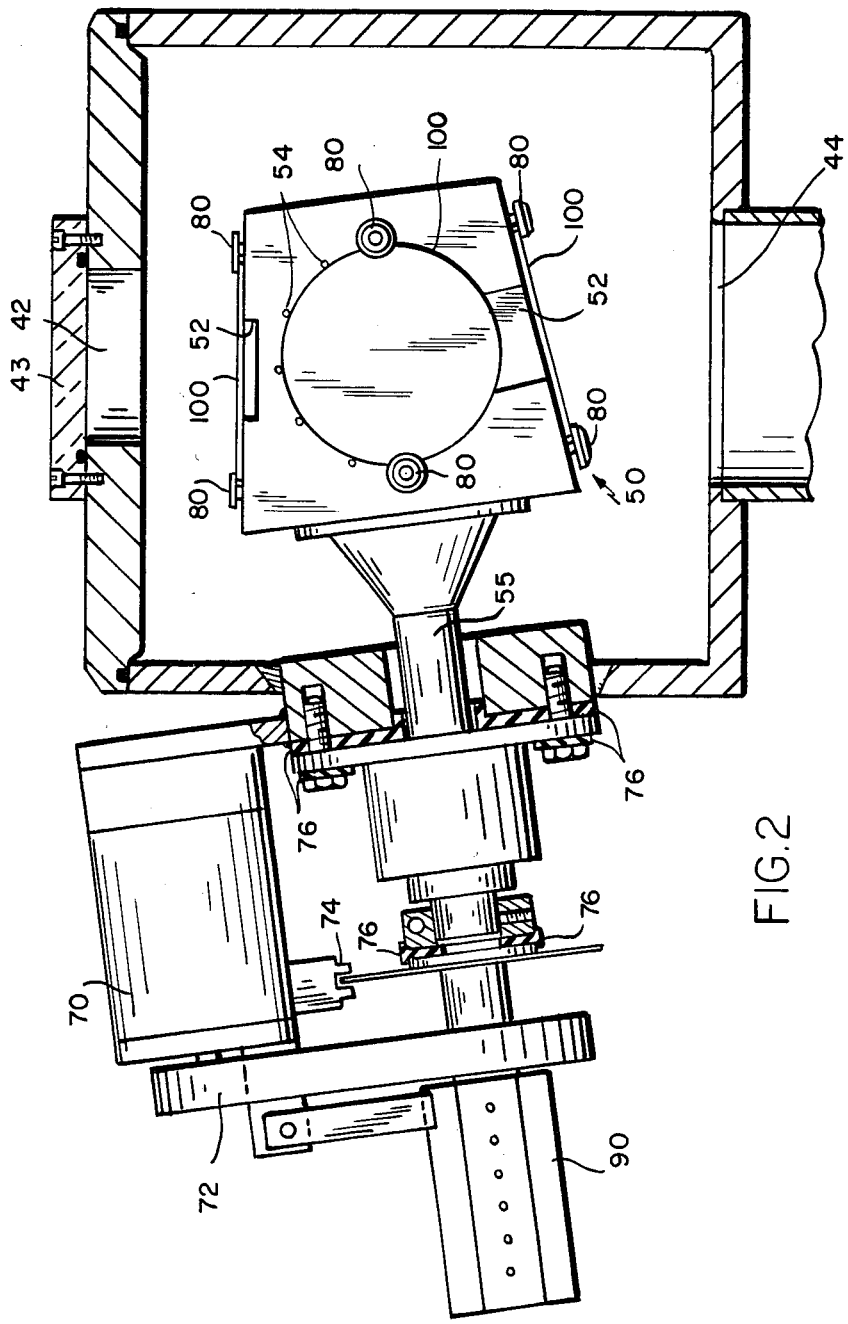
FIG. 2 is an elevational view of the wafer holding apparatus of the present invention taken through lines 2—2 of FIG. 1.

Referring now to FIG. 2, the wafer holding device of the present invention is illustrated. The frustum 50 has a rear end connected to the shaft 55 and a front end connected to the rear end by four trapezoidally shaped sides 57. The frustum 50 is supported by a shaft 55. The shaft 55 is at an angle with respect to the horizontal so that the top side of the frustum 50 is horizontal. Each side 57 has slot 52 for receiving the platform 32 of the robot arm 30. The platform 32 moves within the slot 52 and moves the wafer 100 against a set of silicone stops 54 which project from each side 57 of the frustum 50. When the wafer 100 is in position against these stops 54, two clamps 80 come down against the wafer to hold it in place. The robot platform 32 descends within the slot 52 and then the robot arm 30 removes the platform 32 from the side 57. The controls for directing the robot arm 30, activating the clamps 80, rotating the frustum 50, and activating the valves 25 and operating the vacuum are preferably coordinated by a suitable microprocessor unit.

The frustum 50 is shown in FIG. 2 within the vacuum chamber 40. At the top of the chamber, a viewing port 42 is provided. The port is covered by a piece of lucite 43 anchored against the chamber wall. The viewing port 42 allows an operator to watch the operation of the ion implantation apparatus. Beneath the frustum 50 is the vacuum pump port 44 which connects the vacuum chamber 40 to a vacuum pump. The vacuum pump keeps the vacuum chamber 40 at a pressure of $10_{-5}$ torr. or less.

Figure 3:
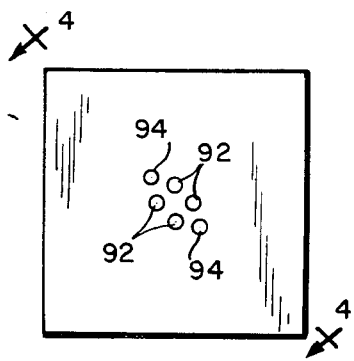
FIG. 3 is an end view of the rotatable frustum taken through the rear end.
Figure 4:
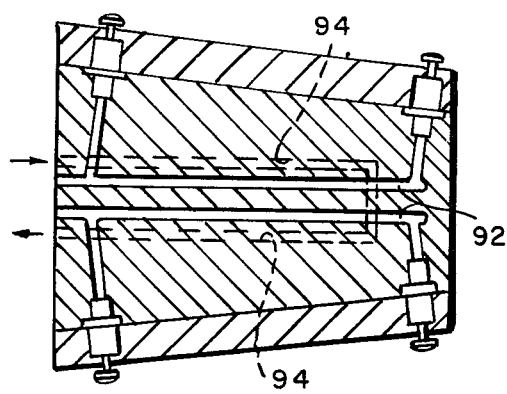
FIG. 4 is a cross-sectional view of the rotatable frustum taken through line 4—4 of FIG. 3.

The inside of the frustum 50 is shown in FIGS. 3 and 4. The ion implantation process causes a build up of heat on the frustum 50. Therefore, it is necessary to provide a cooling system to prevent the temperature of the frustum from getting too high. In the preferred embodiment, coolant passages 94 are provided for allowing a coolant, such as water, to circulate within the frustum. The coolant is carried in and out through two passages 94 within the shaft 55.

Figure 5:
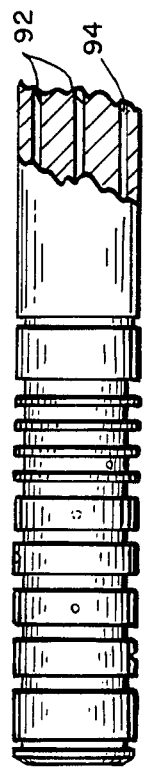
FIG. 5 is an elevational view with partial cross-section of the rotary seal shaft with its cover removed.

The clamps 80 in the preferred embodiment are operated through air pressur which is carried to the frustum 50 through air passageways 92. The shaft 55 contains one air passageway 92 for each side of the frustum 50. A rotary seal shaft 90 is connected to the end of the shaft 55. The rotary seal shaft 90 has an outside cover which does not rotate. The rotary seal shaft 90 is shown without its cover in FIG. 5. Air and water lines are fed through the cover into an annulus about the inside portion of the rotary seal shaft 90. Each annulus for each of the air and water lines is separated from one another by a ring which seals the air and water passages from one another yet allows the shaft to turn without requiring the input hoses to turn.

The power for turning the frustum 50 is provided by a motor 70 shown in FIG. 2. The motor 70 is connected to the shaft 55 by a drive belt 72. A position sensor 74 is provided so that the rotational position of the frustum 50 may be accurately maintained. In the presently preferred embodiment, sensor 74 is an optical sensor. To allow for measurement by an external meter of the ion current or total dose produced by the ion implantation process upon the frustum 50, insulation 76 is provided in several places along the shaft 55 as shown in FIG. 2.

Figure 6:
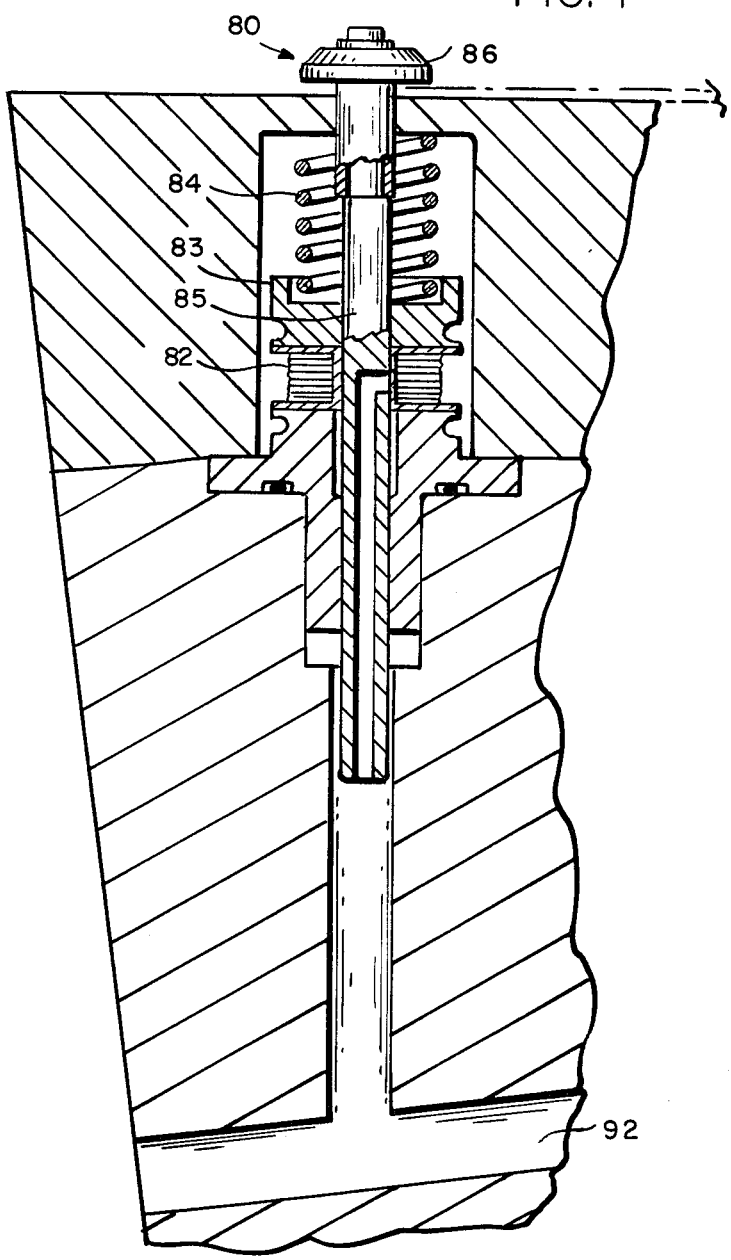
FIG. 6 is a cross-sectional view of a clamp on the rotatable frustum.

A clamp 80 for holding a wafer 100 against the side of the frustum 50 is shown in greater detail in FIG. 6. A clamp head 86 is connected to a bellows 82 by a clamp shaft 85. There is a platform 83 at the top of the bellows 82. A spring 84 pushes against this platform 83 to urge the clamp head down and provides the force for holding the wafer 100 in place. After a wafer 100 has been through the ion implantation process and it is at the top of the frustum 50, it is ready for removal. When the robot platform is in place underneath the wafer, air is sent through the passageway 92 to urge the bellows 82 upwards thus opposing the force of the spring 84. Enough air pressure will be provided into the bellows 82 to cause the clamp head 86 to rise thereby releasing the wafer 100 for removal by the robot arm 30. When the robot arm 30 has replaced this wafer with a new wafer, the air pressure through passageway 92 is shut off and the spring 84 will return to forcing the clamp head 86 down against the new wafer.

The design of the ion implantation apparatus of the present invention provides a desirably high thruput. The transfer of wafers from their storage compartment 20 to the wafer holding device is totally performed within a vacuum so that no time is wasted by a depressurization process. The frustum 50 also contributes to a high thruput by providing rapid insertion and removal of wafers from the implantation position in front of an ion beam.

The trapezoidal shape of the sides of the frustum also provides advantages. Semiconductor wafers are generally sliced off of long cylinders of semiconductor material. A major semiconductor crystallographic axis in the cylinders would normally be aligned along the axis of the cylinder. As a result, if an ion beam is directed perpendicular to a semiconductor wafer, the crystalline alignment allows the ions to penetrate to a depth greater than is desired. Therefore, it is preferable for ion implantation to be done at an angle of 7 or more from the perpendicular to the wafer being implanted. The trapezoidal shaped sides introduce an inclination into the frustum so that the ion implantation side is at an angle with respect to a plane perpendicular to the ion beam 60.

Of course, it should be understood that various changes and modifications to the preferred embodiments described above will be apparent to those skilled in the art. For example, the holding device may have any number of sides without any restriction as to shape, and the top side need not be horizontal. These changes and modifications can be made without departing from the spirit and the scope of the invention and without diminishing its attendant advantages. It is therefore intended that such changes and modifications be covered by the following claims.

I claim:

1. An apparatus for the implantation of ion into semiconductor wafers comprising:
   a plurality of storage compartments that are loaded with a plurality of said wafers at atmospheric pressure;
   means for pumping down each of said storage compartments to a vacuum;
   a vacuum chamber for receiving an ion beam directed into said chamber;
   valve means connected between each of said storage compartments and said vacuum chamber, each of said valve means being opened when its corresponding storage compartment has been pumped down to a vacuum;
   a rotatable block located within said vacuum chamber for holding said wafers in position with respect to said ion beam so as to obtain ion implantation into said wafer, said rotatable block having a rear end, a front end and a plurality of sides connecting the rear end to the front end;
   clamping means on each side of said block for holding a wafer against said block; and
   wafer handling means located within said vacuum chamber for transferring said wafers between said storage compartments and said wafer holding means.

2. The apparatus of claim 1 wherein said rotatable block includes four trapezoidal sides.

3. The apparatus of claim 1 wherein said clamping means is air operated.

4. An apparatus for the implantation of ions into semiconductor comprising:
   a plurality of storage compartments that are loaded with a stack of said wafers at atmospheric pressure, said storage compartments including elevator means for raising and lowering said stack of said wafers;
   means for pumping down each of said storage compartments to a vacuum;
   a vacuum chamber for receiving an ion beam directed into said chamber;
   valve means connected between each of said storage compartments and said vacuum chamber, each of said valve means being opened when its corresponding storage compartment has been pumped down to a vacuum;
   wafer holding means located within said vacuum chamber for holding said wafers in position with respect to said ion beam so as to obtain ion implantation into said wafer; and
   wafer handling means located within said vacuum chamber for transferring said wafers between said storage compartments and said wafer holding means.

5. A wafer holding apparatus comprising:
   a rotatable block having a rear end, a front end and a plurality of sides connecting the rear end to the front end;
   clamping means on each side of said block for holding a wafer against said block;
   means for supporting said block; and
   means for rotating said block.

6. The wafer holding apparatus of claim 5 wherein said supporting means is arranged to horizontally position a side of said block.

7. The wafer holding apparatus of claim 6 wherein said supporting means is a shaft inclined relative to horizontal.

8. The wafer holding apparatus of claim 5 wherein said rotatable block includes passage under its surfaces for allowing a coolant to circulate through the block.

9. The wafer holding apparatus of claim 5 wherein the sides of said rotatable block are trapezoidally shaped.

10. The wafer holding apparatus of claim 5 wherein said rotatable block has four sides.

11. The wafer holding apparatus of claim 5 wherein each side of said rotatable block includes a slot for receiving a wafer handling device.

12. The wafer holding apparatus of claim 5 wherein said clamping means is air-operated.

13. A wafer holding apparatus comprising:
   a rotatable frustum having a front end, a rear end and four trapezoidally shaped sides;
   clamping means on each trapezoidally shaped side of said frustum for holding a wafer against said frustum;
   a shaft inclined relative to horizontal to support said frustum so that the trapezoidal side in a top position is horizontal; and
   means for rotating said frustum so that each side will go through the top position.

14. The wafer holding apparatus of claim 13 wherein said clamping means comprises air operated reciprocating heads.

15. The wafer holding apparatus of claim 13 wherein each side of said rotatable frustum includes a slot for receiving a wafer handling device.

16. The wafer holding apparatus of claim 15 wherein each side of said rotatable frustum includes stopping means for positioning a wafer on the side.

17. An apparatus for the implantation of ions into semiconductor wafers comprising:
   a vacuum chamber;
   an ion beam source directing an ion beam into said chamber; and
   a wafer holding apparatus including:
      a rotatable block having a rear end, a front end and a plurality of sides connecting the rear end to the front end;
      clamping means on each side of said block for holding a wafer against said block;
      means for supporting said block so that the side of said block in a top position is horizontal and so that one other side of said block is aligned at an angle with respect to the perpendicular to said ion beam for implantation of ions into the wafer on said other side; and means for rotating said block so that each side will go through the top position.

18. The ion implantation apparatus of claim 17 wherein said block includes passages under its surfaces for allowing a coolant to circulate through said block.

19. The ion implantation apparatus of claim 17 wherein said clamping means is air operated.

20. The ion implantation apparatus of claim 17 wherein said supporting means comprises a shaft inclined relative to horizontal.

21. The ion implantation apparatus of claim 17 further comprising wafer handling means located within said vacuum chamber for loading and unloading wafers to and from the side of said block in the top position.

22. The ion implantation apparatus of claim 21 wherein said loading and unloading means comprises a robot arm.

23. The ion implantation apparatus of claim 21 further comprising elevator means connected with said vacuum chamber for raising or lowering a stack of wafers so that said wafer handling means can easily access the desired wafer from said stack.

* * * * *